(12) United States Patent
Haupt et al.

(10) Patent No.: US 7,265,023 B2
(45) Date of Patent: Sep. 4, 2007

(54) FABRICATION METHOD FOR A SEMICONDUCTOR STRUCTURE

(75) Inventors: Moritz Haupt, Dresden (DE); Andreas Klipp, Dresden (DE); Hans-Peter Sperlich, Dresden (DE); Momtchill Stavrev, Dresden (DE); Stephan Wege, Weissig (DE)

(73) Assignee: Infineon Technologies AG, Munich (DE)

( * ) Notice: Subject to any disclaimer, the term of this patent is extended or adjusted under 35 U.S.C. 154(b) by 331 days.

(21) Appl. No.: 11/099,962

(22) Filed: Apr. 6, 2005

(65) Prior Publication Data

US 2005/0245042 A1      Nov. 3, 2005

(30) Foreign Application Priority Data

Apr. 28, 2004      (DE) ...................... 10 2004 020 834

(51) Int. Cl.
*H01L 21/76*      (2006.01)
(52) U.S. Cl. ................. 438/424; 438/710; 257/E21.597
(58) Field of Classification Search ................ 438/428, 438/429
See application file for complete search history.

(56) References Cited

U.S. PATENT DOCUMENTS 6,159,862 A      12/2000      Yamada et al.
6,277,706 B1 *      8/2001      Ishikawa ..................... 438/424

2002/0039843 A1      4/2002      Ikeda et al.
2005/0156274 A1 *      7/2005      Yeo et al. .................... 257/510

FOREIGN PATENT DOCUMENTS

DE      102 25 941 A1      8/2004
JP      1041 613 A1      10/2000
JP      2003234328 A      8/2003

OTHER PUBLICATIONS

German Office Action dated Jan. 12, 2005.

* cited by examiner

*Primary Examiner*—Michael Lebentritt
*Assistant Examiner*—Cheung Lee
(74) *Attorney, Agent, or Firm*—Jenkins, Wilson, Taylor & Hunt, P.A.

(57) ABSTRACT

The present invention provides a fabrication method for a semiconductor structure having the steps of providing a semiconductor substrate (1); providing and patterning a silicon nitride layer (3) on the semiconductor substrate (1) as topmost layer of a trench etching mask; forming a trench (5) in a first etching step by means of the trench etching mask; conformally depositing a liner layer (10) made of silicon oxide above the resulting structure, which leaves a gap (SP) reaching into the depth in the trench (5); carrying out a V plasma etching step for forming a V profile of the line layer (10) in the trench (5); wherein the liner layer (10) is pulled back to below the top side of the silicon nitride layer (3); an etching gas mixture comprises $C_5F_8$, $O_2$ and an inert gas is used in the V plasma etching step; the ratio (V) of $C_5F_8/O_2$ lies between 2.5 and 3.5; and the selectivity of the V plasma etching step between silicon oxide and silicon nitride is at least 10.

8 Claims, 6 Drawing Sheets

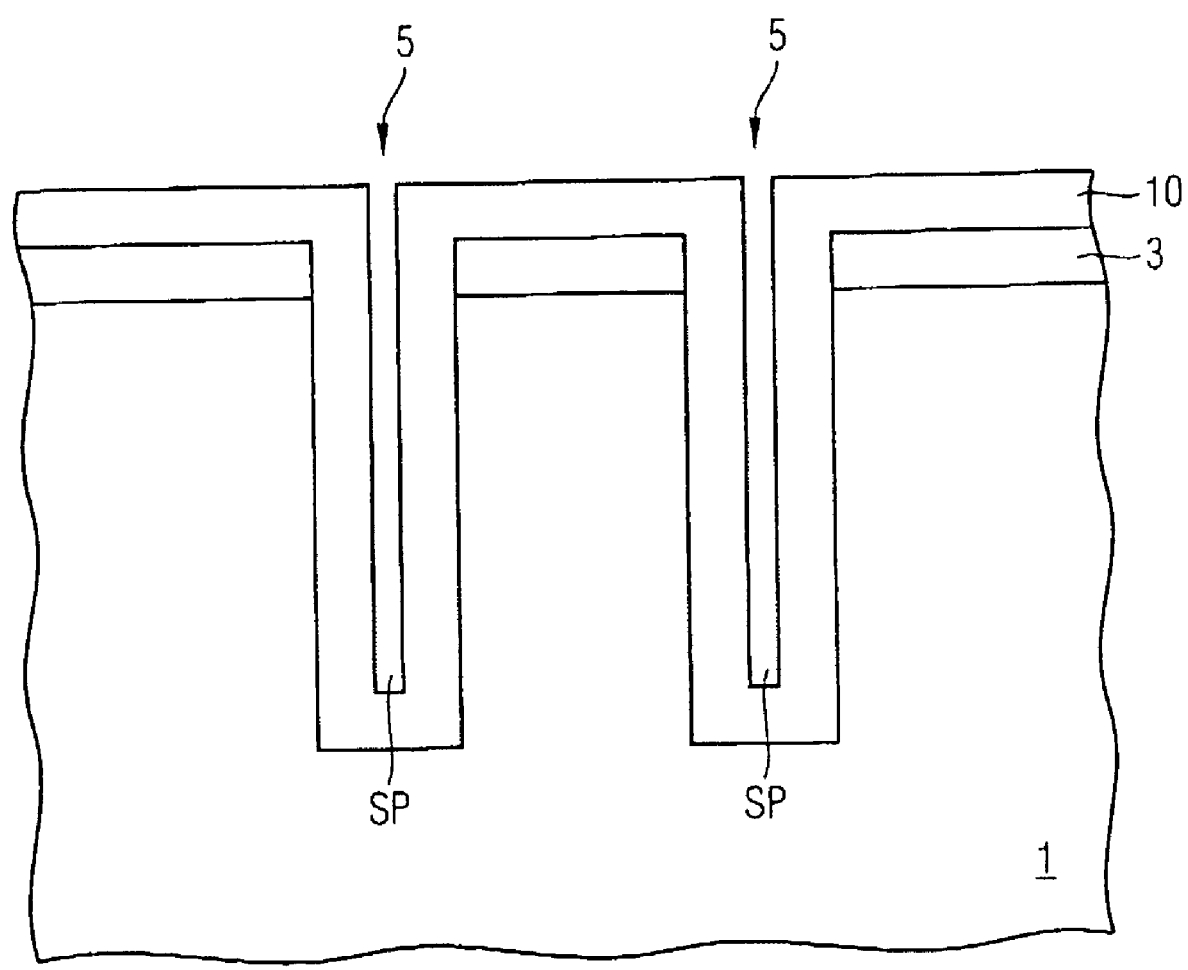

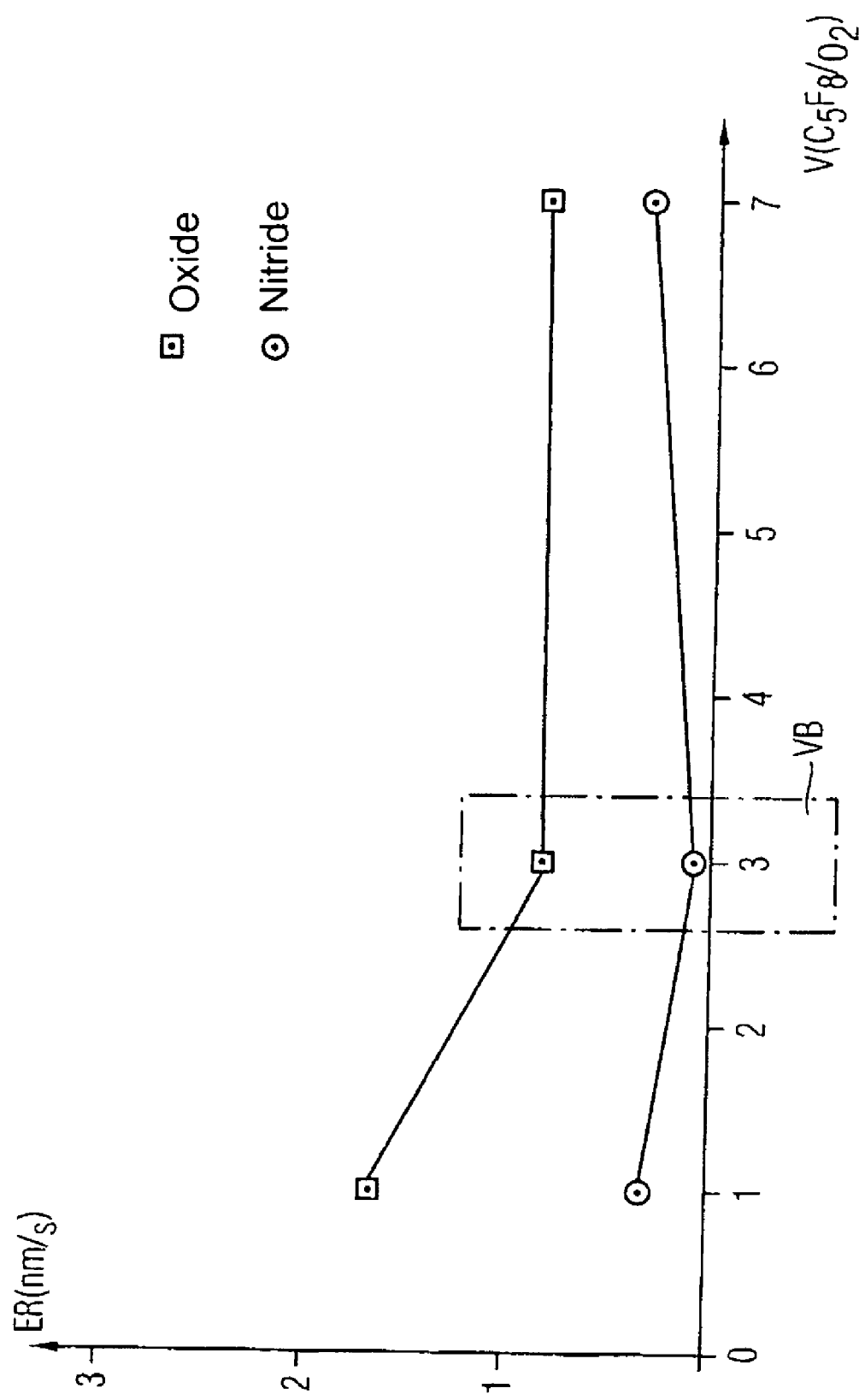

FABRICATION METHOD FOR A SEMICONDUCTOR STRUCTURE

TECHNICAL FIELD

The present invention relates to a fabrication method for a semiconductor structure.

BACKGROUND ART

The continual scaling of semiconductor components is generally also accompanied by an increase in the aspect ratio (depth/width) of the trench and relief structures therein, which are formed on substrates. At a structural level of ≦100 nm, aperture angles of around 0.1° are achieved in some instances. The small aperture angles make it increasingly difficult to fill these extremely steep profiles. Although highly conformal deposition methods (almost 100%) have been specially developed for a wide variety of conducting or insulating filling layers, extremely small production-dictated profile fluctuations result in the occurrence of non-ideally closed closing joints (voids) along the center axis of such filled trench and relief structures.

The particular disadvantages of such voids are to be seen in the fact that they reduce the geometrical cross-section of conductive fillings in an uncontrolled manner and thereby increase the electrical resistance thereof or adversely affect other parameters. Thus, storage capacitors for DRAM cells are fabricated for example by deep trench etching, dielectric coating of the trench walls and subsequent filling of the trench with a conductive material. Voids in this conductive filling increase the resistance thereof in an uncontrolled manner.

For the frequently occurring case in which fillings of trenches or reliefs have to be superficially planarized or (partially) etched back (recess etching) for functional reasons, voids in the filling lead, depending on their size, to local fluctuations in the planarization or recess etching rate. That leads to uncontrollable fluctuations for the depth position and the profile of the planarized or recess areas. Generally, the void region is significantly enlarged in terms of width and depth. Under certain circumstances, that affects the further processing and the parameters of these arrangements by a non-reproducible (V-shaped) relief of the planarization or recess surface of the primary filling being reproduced in a subsequent layer deposition. If the subsequent layer is then to be removed again by means of anisotropic RIE etching (reactive ion etching) on the recess surface, that is not completely successful. The cause of this is that the layer material of the subsequent layer has been deposited deep into the void region. That then leads to electrical short circuits (given insulated filling layer and conductive subsequent layer) or to interruptions in the current path (given conductive filling layer and insulating subsequent layer) and may additionally act as a particle and contamination source during the further processing.

The production of these voids has been avoided hitherto by means of a sufficiently V-shaped profile of the trench or relief structures. During a highly conformal deposition of the filling layer, the latter thereby accretes from bottom to top in void-free fashion at its seam location. The further scaling of the structures means that it is no longer possible to furnish the area requirement for the wall inclination of the trench or relief structures. The reproducible setting of very steep sidewalls of the trench or relief structures is extremely problematic, which is why this method is increasingly failing to work.

Another practically proven possibility for subsequently closing the void independently of the profile of the trench or relief structures consists in the use of an additional thin conformal deposition (divot fill) comprising the same material type (conductive or insulating) as the primary filling layer and subsequent (wet-chemical) removal of the divot fill layer deposited on the substrate surface and on the sidewalls of the relief structure.

In this case, it is disadvantageous that the recess etchings effected before the divot fill are not improved. Primarily, however, the process window for the recess etching of the divot fill is very small. Either residues subsequently remain on the substrate surface and the walls of the trench or relief structures, or the void is completely or at least partially opened again.

DE 102 25 941 A1 discloses a method for filling trench and relief structures formed in a semiconductor substrate, the trench and relief structures being coated, in a first deposition process, with a first primary filling layer with high conformity and minimal roughness, a V etching that extends right into a predetermined depth of the trench structure, for producing a V profile, subsequently being performed and then a second primary filling layer being deposited with high conformity and minimal roughness until the trench and relief structure is completely closed.

In particular, DE 102 25 941 A1 discloses that the V etching is effected by means of plasma-chemical etching, the etching rate thereof being set such that it decreases significantly into the depth of the trench and relief structure compared with the etching rate at the surface of the semiconductor substrate.

An example specified therein relates to preventing voids in STI fillings (shallow trench isolation), the first and second filling layers being made of $SiO_2$.

It has been found in practice that there are problems in implementing the method disclosed in DE 102 25 941 A1 since, with progressive V etching, the edges at the top side of the trench structure are rounded after the first filling layer has been removed from the top side. Problems also arise in respect of achieving the desired V profile.

SUMMARY OF THE INVENTION

Therefore, it is an object of the present invention to provide a fabrication method for a semiconductor structure which produces improved V profiles and makes it possible to avoid the edge rounding at the top side of the trench structure.

According to the invention, this problem is solved by means of the fabrication method specified in claim 1.

The idea on which the present invention is based consists in using a special etching gas composition or conditioning in the V etching step.

Said special etching gas composition advantageously results in improved V profiles and avoids edge rounding at the top side of the trench structure on account of high selectivity of the V etching step of a silicon oxide used as filling layer with respect to a surface layer made of silicon nitride.

Advantageous developments and improvements of the respective subject matter of the invention are found in the subclaims.

In accordance with one preferred development, the proportion of the inert gas in the etching gas mixture is 20 to 200 times the joint proportion of $C_5F_8$ and $O_2$.

In accordance with a further preferred development, the inert gas is Ar.

In accordance with a further preferred development, the pressure in the V plasma etching step lies between 20 and 50 mtorr.

In accordance with a further preferred development, the power in the plasma etching step lies between 3 and 500 watts.

In accordance with a further preferred development, after the liner layer has been pulled back to below the top side of the silicon nitride layer, a filling layer is provided in the trench, said filling layer filling the trench in a manner free of shrink holes.

In accordance with a further preferred development, the filling layer is made of silicon oxide.

In accordance with a further preferred development, the liner layer and/or the filling layer are made of TEOS or HDP oxide.

An exemplary embodiment of the invention is illustrated in the drawings and is explained in more detail in the description below.

BRIEF DESCRIPTION OF THE DRAWINGS

FIGS. 1a-e show schematic illustrations of successive method stages of a method for fabricating a semiconductor structure as an embodiment of the present invention; and FIG. 2 shows a schematic illustration of the etching rates of oxide and nitride as a function of the etching gas composition.

DETAILED DESCRIPTION OF THE INVENTION

In the figures, identical reference symbols designate identical or functionally identical component parts.

FIGS. 1a-e show schematic illustrations of successive method stages of a method for fabricating a semiconductor structure as a first embodiment of the present invention.

Figure 1A:
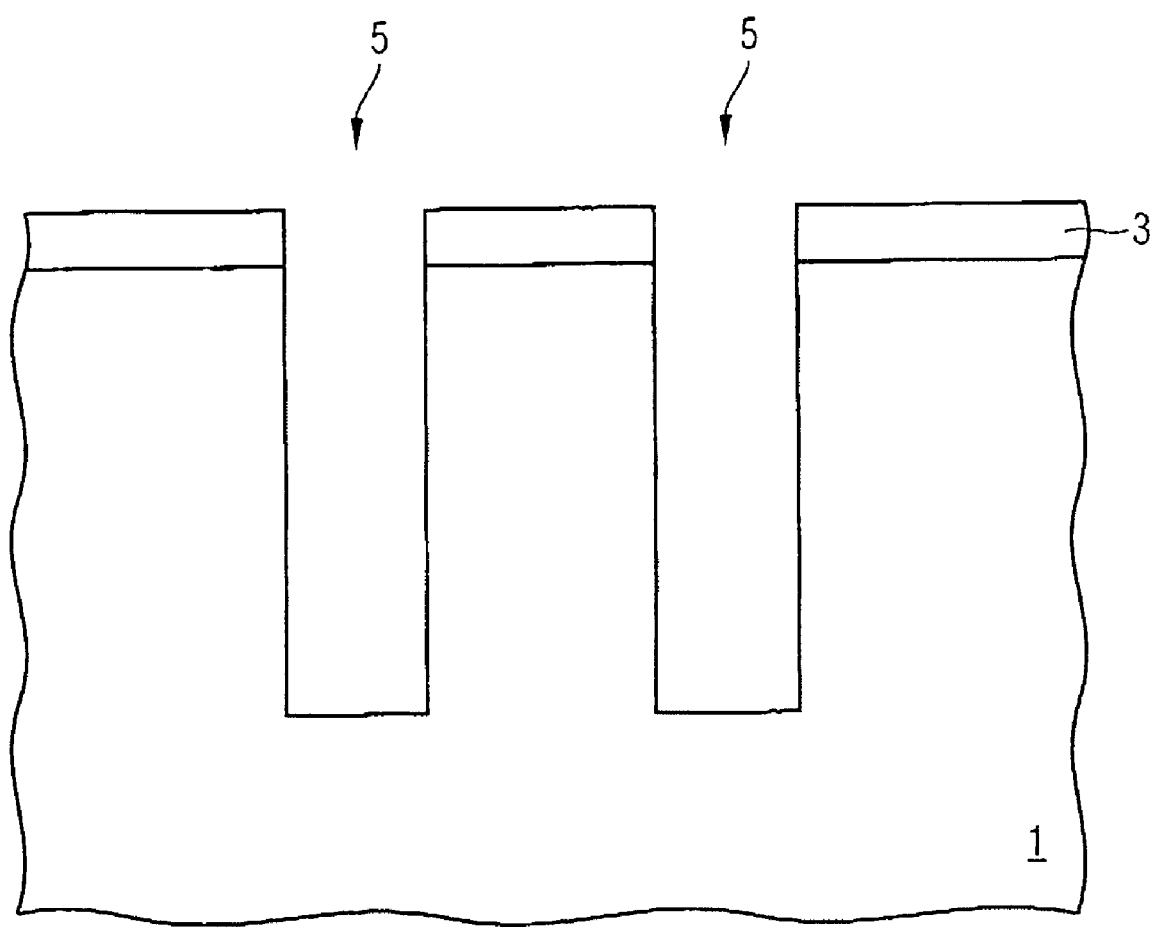

In FIG. 1A, reference symbol 1 designates a silicon semiconductor substrate in which trenches 5 having a depth of typically 6 μm to 8 μm have been introduced by means of a hard mask comprising a pad oxide layer (not shown) and an overlying pad nitride layer 3.

In a first process step in accordance with FIG. 1B, a liner layer 10 made of TEOS is deposited conformally above the structure with the trenches 5 and the pad nitride layer 3 situated on top. This process step is intended to provide a surface with relatively low roughness for the subsequent filling steps. What is also important in this case is that the liner layer 10 does not completely close the trenches 5, but rather leaves a comparatively deep gap SP.

Figure 1C:
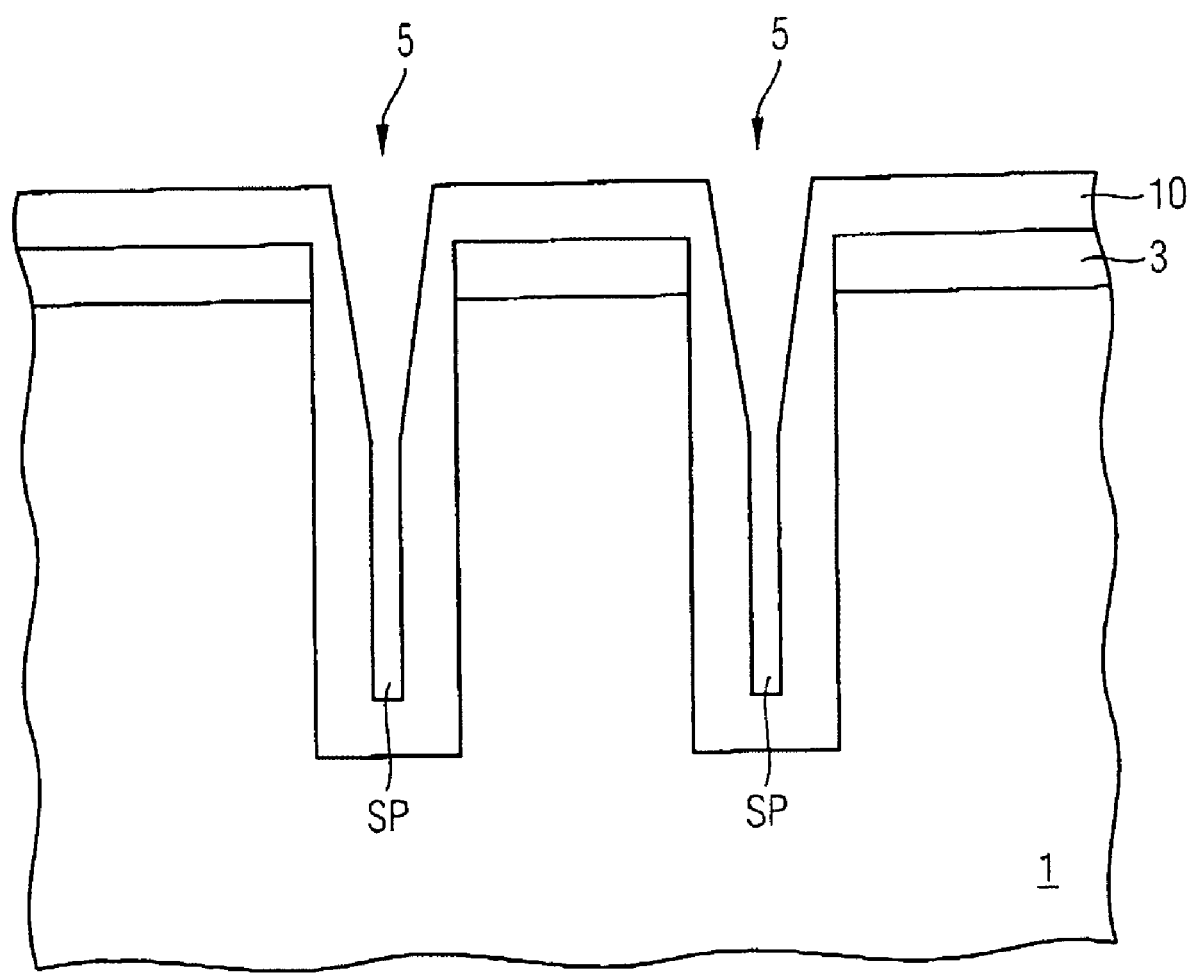

Referring to FIG. 1C, a V plasma etching step is then effected, in which $C_5F_8$, $O_2$ and Ar are used as etching gases. The ratio V of $C_5F_8$ to $O_2$ is approximately 3. The inert gas argon is used for dilution by approximately a factor of 50. The plasma power is 500 watts and the pressure is 30 mbar. The flows are 450 sccm (Ar), 6 sccm ($C_5F_8$) and 2 sccm ($O_2$).

FIG. 1C shows the initial phase of the V plasma etching step, in which the etching has not yet reached the pad nitride layer 3.

Figure 1D:
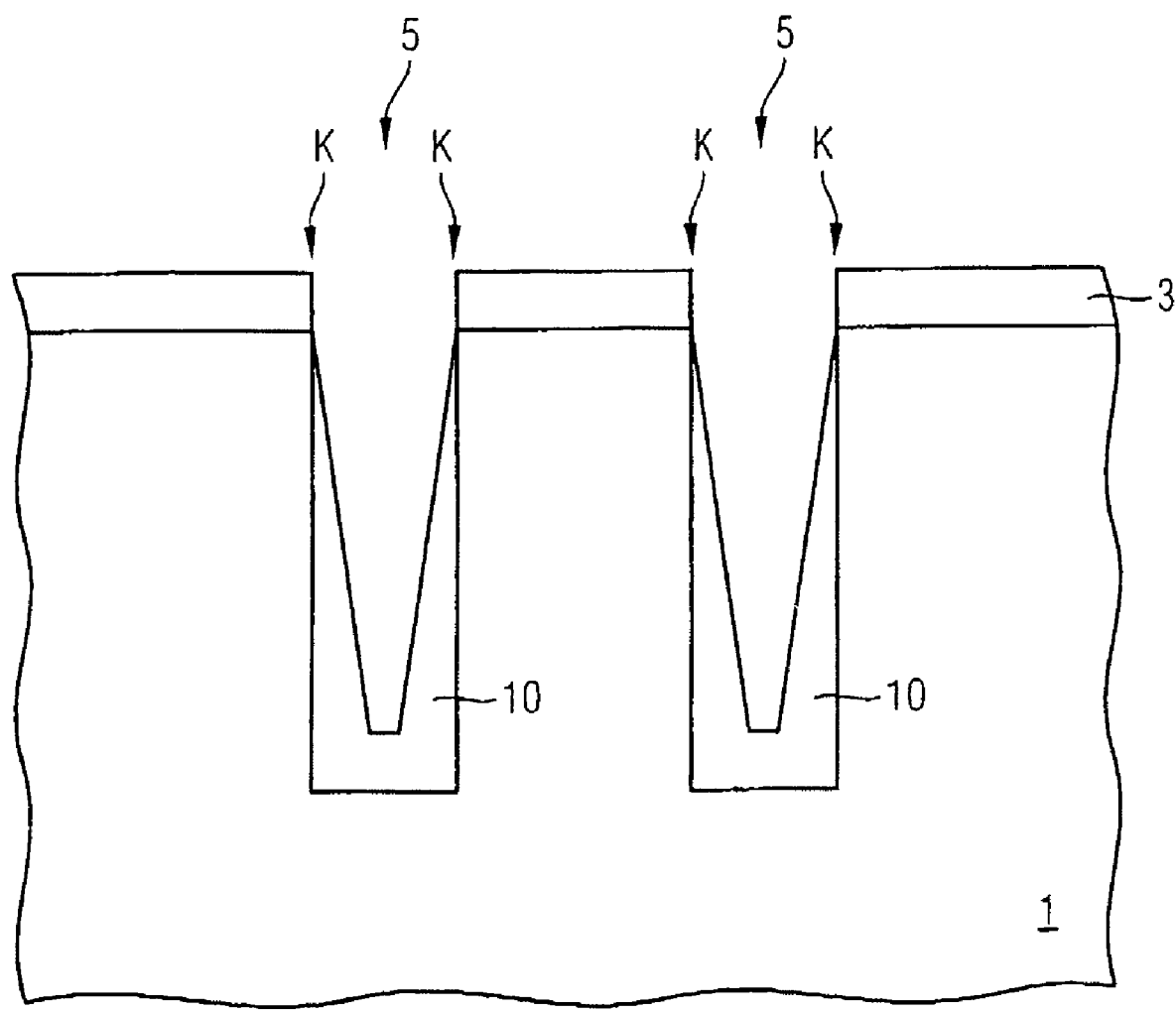

Referring further to FIG. 1D, the final result of the V plasma etching step is shown. The liner layer 10 made of TEOS has been pulled back in V-shaped fashion right into the trench 5 below the top side of the pad nitride layer.

In this case, the edges K at the top side of the pad nitride layer 3 have not been rounded during the V plasma etching step in accordance with this embodiment since the etching gas composition or conditioning entails a selectivity of approximately 20 of the oxide etching with respect to the nitride etching. In this case, the etching rates are approximately 0.77 nm per second for the oxide and 0.04 nm per second for the nitride.

The cause of the V-shape in the case of this etching resides in an increased deposition of polymer in the lower trench region caused by the angular distribution of the scattered inert gas ions.

Figure 1E:
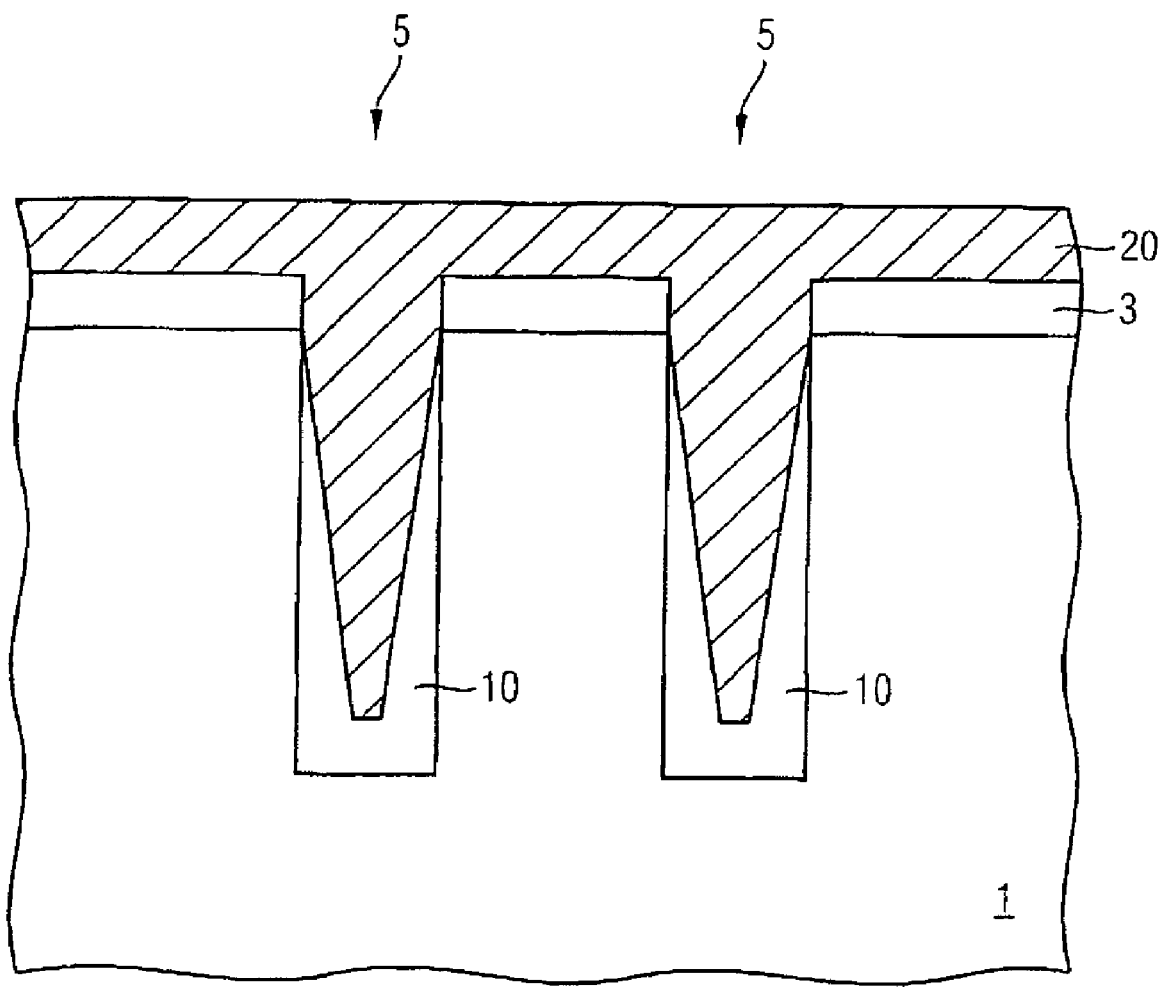

Finally, referring to FIG. 1E a cleaning step is effected in order to remove polymer residues in the trenches 5, followed by shrink-hole-free filling of the trenches 5 by means of a filling layer 20, which is also composed of TEOS in the present example.

The filling layer 20 made of TEOS may optionally be subsequently polished back as far as the top side of the pad nitride layer 3 by means of CMP step (chemical mechanical polishing). It is furthermore possible also to effect annealing of the filling layer 20 either before or after the optional CMP step.

FIG. 2 shows a schematic illustration of the etching rates of oxide and nitride as a function of the etching gas composition during the V plasma etching step, the etching rates ER being specified in nm/s.

It is clearly discernible that the etching rate ER of the oxide, which is specified by the square symbols, is always significantly higher than the etching rate of nitride, which is specified by the round symbols.

The etching rate ER of the oxide is approximately 1.8 nm/s given a ratio V=1 of $C_5F_8$ to $O_2$ and decrease to approximately 0.9 nm/s up to a ratio of V=3, after which it remains at this value even in the case of increasing ratios V up to approximately 7.

The etching rate of nitride is approximately 0.3 nm/s given the ratio V=1 and decreases to 0.04 nm/s up to a ratio of V=3. The etching rate of nitride rises to the value of approximately 0.3 nm/s again in the case of an increasing ratio up to a value of V=7.

Experiments have shown that the selectivity is greatest given a ratio of V=3, the selectivity then being 20:1. However, ratios up to a value of 2.5, on the one hand, and 3.5, on the other hand, also still yield good values of the selectivity which are greater than 10. Consequently the composition range designated by VB has been found to be particularly preferred for the V plasma etching according to the invention.

In the case of smaller ratios, the etching rate of oxide becomes too high, and in the case of increasing ratios, the deposition of polymer in the lower trench region which is responsible for the V profile becomes too great.

In the case of the further parameters, it has been found that a dilution of the etching gases by an inert gas, in this case argon, by a factor of 50 yields very good results. However, dilutions of between 20 and 200 also still yield acceptable values. The magnitude of the etching gas flow is noncritical. By contrast, the power of the plasma reactor should be low and lie between 300 and 500 watts and the pressure should also lie in a moderate range of between 20 and 50 mbar.

Although the present invention has been described above on the basis of a preferred exemplary embodiment, it is not restricted thereto, but rather can be modified in diverse ways.

In particular, the invention can be applied in principle to any desired trench or relief structures.

Although the filling layer 20 was likewise composed of TEOS in the embodiment portrayed above, this is not absolutely necessary. Moreover, the material that can be used for the liner layer or filling layer is in principle any silicon oxide, and not just TEOS, that is to say in particular also HDP oxide or some other CVD oxide.

LIST OF REFERENCE SYMBOLS

1 Semiconductor substrate
3 Pad nitride layer
5 Trench
10 Liner layer
20 Filling layer
K Edge
B1 Etching region
B2 Deposition region
VB Preferred etching region

What is claimed is:

1. Fabrication method for a semiconductor structure having the steps of:
(a) providing a semiconductor substrate;
(b) providing and patterning a silicon nitride layer on the semiconductor substrate as topmost layer of a trench etching mask;
(c) forming a trench in a first etching step by means of the trench etching mask;
(d) depositing conformally a liner layer made of silicon oxide above the resulting structure, which leaves a gap reaching into the depth in the trench;
(e) carrying out a V plasma etching step for forming a V profile of the liner layer in the trench; wherein (i) the liner layer is pulled back to below the top side of the silicon nitride layer;
(ii) an etching gas mixture comprises $C_5F_8$, $O_2$ and an inert gas is used in the V plasma etching step;
(iii) the ratio of $C_5F_8/O_2$ lies between 2.5 and 3.5; and
(iv) the selectivity of the V plasma etching step between silicon oxide and silicon nitride is at least 10.

2. Method according to claim 1, wherein the proportion of the inert gas in the etching gas mixture is 20 to 200 times the joint proportion of $C_5F_8$ and $O_2$.

3. Method according to claim 1 wherein the inert gas is Ar.

4. Method according to claim 1, wherein the pressure in the V plasma etching step lines between 20 and 50 mTorr.

5. Method according to claim 1, wherein the power in the V plasma etching step lies between 3 and 500 watts.

6. Method according to claim 1, wherein after the liner layer has been pulled back to below the top side of the silicon nitride layer, a filling layer is provided in the trench, said filling layer filling the trench in a manner free of shrink holes.

7. Method according to claim 6, wherein the filling layer is made of silicon oxide.

8. Method according to claim 1, wherein the liner layer and/or the filling layer are made of TEOS or HDP oxide.

* * * * *